United States Patent
Rogers et al.

(10) Patent No.: US 10,777,978 B2
(45) Date of Patent: Sep. 15, 2020

(54) SYSTEMS AND METHODS FOR A MODULAR ENCLOSURE WITH A DOOR INTERLOCK

(71) Applicant: ROCKWELL AUTOMATION TECHNOLOGIES, INC., Mayfield Heights, OH (US)

(72) Inventors: Jordan E. Rogers, Waukesha, WI (US); Ahmad K. Omari, Bayside, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 145 days.

(21) Appl. No.: 15/966,964

(22) Filed: Apr. 30, 2018

(65) Prior Publication Data
US 2019/0334324 A1    Oct. 31, 2019

(51) Int. Cl.
*H02G 3/08* (2006.01)
*H02B 1/14* (2006.01)
(Continued)

(52) U.S. Cl.
CPC ............ *H02B 1/14* (2013.01); *A47B 47/0091* (2013.01); *E05B 65/06* (2013.01); *E05C 3/14* (2013.01);
(Continued)

(58) Field of Classification Search
CPC ........... H02G 3/08; H02G 3/081; H05K 5/00; H05K 5/02; H05K 5/0217; H05K 5/0208; H05K 5/0004; H05K 5/0247; H05K 5/04; H05K 5/061; H05K 5/0221; H02B 1/26; H02B 1/30; H02B 1/306; H02B 1/38;
(Continued)

(56) References Cited

U.S. PATENT DOCUMENTS 5,239,129 A * 8/1993 Ehrenfels ................. H02G 3/10
174/51
6,545,859 B2    4/2003 Leccia
(Continued)

FOREIGN PATENT DOCUMENTS

EP    2624386 A1    8/2013
GB    680165 A    10/1952

OTHER PUBLICATIONS

Rockwell Automation, Arc Flash Protection Marking Guide for Centerline® Low Voltage Motor Control Centers, Apr. 2005, 12 pages.

(Continued)

*Primary Examiner* — Angel R Estrada

(74) *Attorney, Agent, or Firm* — Quarles & Brady LLP

(57) ABSTRACT

A modular enclosure comprises a first enclosure having a first enclosure cavity and a first door, and a second enclosure coupled to the first enclosure, the second enclosure having a second enclosure cavity and a second door. A power handle may be connected to the first enclosure, and can be operable to turn on power to the second enclosure in an "ON" position or turn off power to the second enclosure in an "OFF" position. The modular enclosure may further include a lockout assembly configured to prevent the second door from being opened while the power handle is in the "ON" position, and to prevent the first door from being opened until second door has been opened.

20 Claims, 17 Drawing Sheets

(51) Int. Cl.
*A47B 47/00* (2006.01)
*E05B 65/06* (2006.01)
*E05C 3/14* (2006.01)
*H02B 1/30* (2006.01)
*H02B 1/38* (2006.01)
*H05K 5/02* (2006.01)

(52) U.S. Cl.
CPC ............... *H02B 1/306* (2013.01); *H02B 1/38* (2013.01); *H05K 5/0221* (2013.01); *A47B 2230/07* (2013.01); *E05Y 2900/606* (2013.01)

(58) Field of Classification Search
CPC ... H02B 1/14; A47B 47/0091; A47B 2230/07; E05B 65/06; E05C 3/14; E05Y 2900/606
USPC ............... 174/50, 559, 17 R, 520, 560, 561; 361/600, 601, 724, 730, 752, 796; 312/223.1, 223.2, 265.3; 220/3.2, 4.02
See application file for complete search history.

(56) References Cited

U.S. PATENT DOCUMENTS

| | | | |
|---|---|---|---|
| 6,945,616 B2 * | 9/2005 | Webster | H02B 1/50 312/223.1 |
| 7,348,510 B1 | 3/2008 | Foley et al. | |
| 7,531,761 B2 | 5/2009 | Carson et al. | |
| 7,724,507 B2 | 5/2010 | Whitt et al. | |
| 7,795,532 B2 * | 9/2010 | Walker | H05K 7/186 174/50 |
| 7,965,493 B2 | 6/2011 | Leeman et al. | |
| 8,147,008 B2 | 4/2012 | Guebre-Tsadik et al. | |
| 8,638,561 B2 * | 1/2014 | Lehtola | H05K 7/1409 361/724 |
| 9,144,175 B2 * | 9/2015 | Segroves | H05K 7/1491 |
| 9,451,718 B2 * | 9/2016 | Oneufer | H02B 1/36 |
| 9,603,269 B2 | 3/2017 | Omari et al. | |
| 9,922,785 B2 * | 3/2018 | Jur | H01H 9/22 |
| 2009/0127991 A1 | 5/2009 | Reuter et al. | |

OTHER PUBLICATIONS

Eaton, Double Door Line-Side Isolation Switch, http://www.eaton.com/flash/electrical/doubledoor/index.html, Copyright 2017 Eaton (http://www.eaton.com), 4 pages.

Rockwell Automation, Centerline 2100 Motor Control Centers, Apr. 2005, pp. 23, 50-51, 118-131, 156, 162, 167, 323-324.

European Patent Office, Extended European Search Report, Application No. 19166028.1, dated Sep. 17, 2019, 8 pages.

* cited by examiner

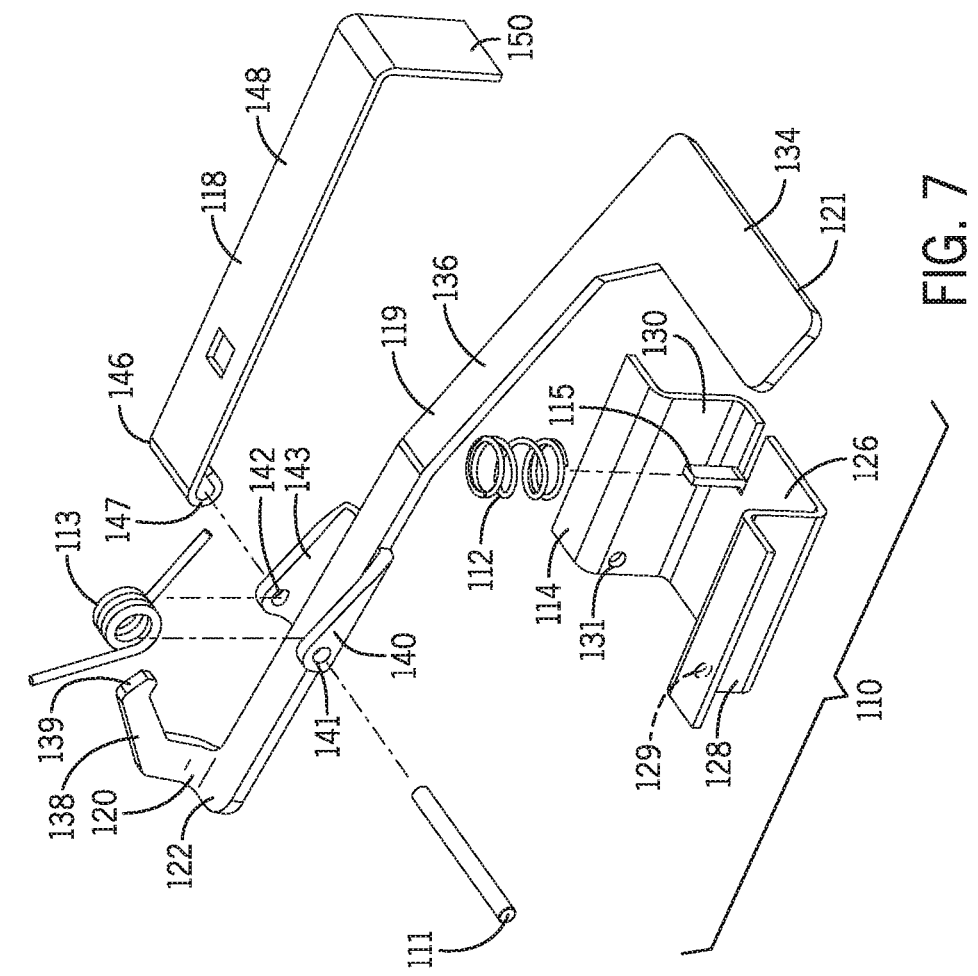
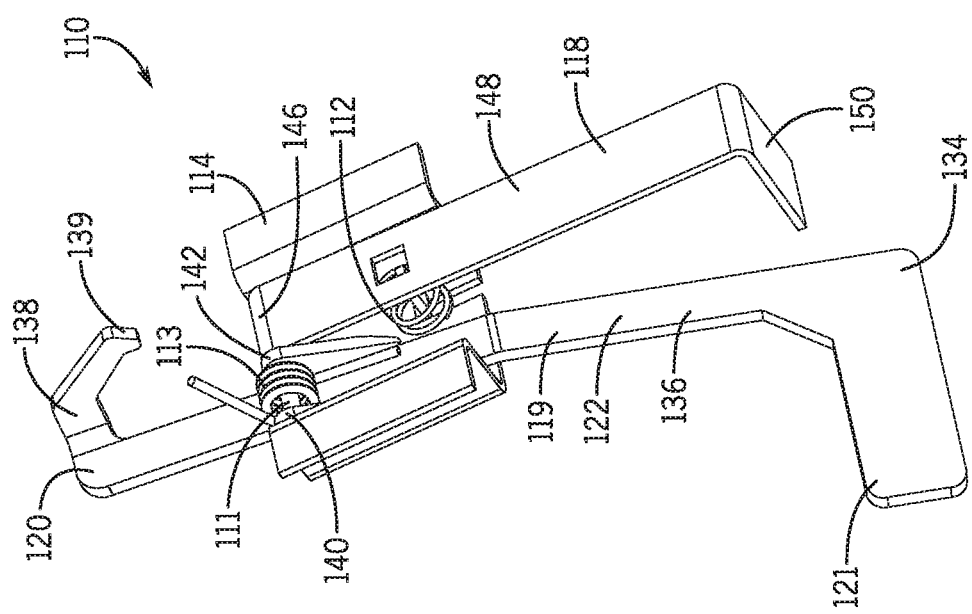

SYSTEMS AND METHODS FOR A MODULAR ENCLOSURE WITH A DOOR INTERLOCK

CROSS-REFERENCES TO RELATED APPLICATIONS

Not applicable.

STATEMENT REGARDING FEDERALLY SPONSORED RESEARCH

Not Applicable

BACKGROUND INFORMATION

The subject matter disclosed within relates generally to electrical enclosures that are used to house electrical components in industrial applications. In particular the subject matter relates to electrical enclosures with a door interlock.

BRIEF DESCRIPTION

In one embodiment, a modular enclosure can comprise a first enclosure having a first enclosure cavity and a first door, and a second enclosure coupled to the first enclosure, the second enclosure having a second enclosure cavity and including a second door. A power handle can be connected to the first enclosure. The power handle can be operable to turn on power to the second enclosure in an "ON" position or turn off power to the second enclosure in an "OFF" position. The modular enclosure can further include a lockout assembly configured to prevent the second door from being opened while the power handle is in an "ON" position. The lockout assembly may include slam catch mechanism to prevent the first door from being opened until second door has been opened.

In one embodiment, a method of disengaging a first door bracket on a first door of an enclosure, the enclosure having the first door and a second door, can include the steps of moving a power handle on the enclosure to actuate an interlock rod, the interlock rod disengaging a second door bracket on the second door, and moving a slam catch mechanism to disengage the first door bracket on the first door.

The foregoing and other aspects and advantages of the invention will appear from the following description. In the description, reference is made to the accompanying drawings which form a part hereof, and in which there is shown by way of illustrations one or more embodiments of the invention. Such embodiments do not necessarily represent the full scope of the invention, however, and reference is made therefore to the claims and herein for interpreting the scope of the invention.

BRIEF DESCRIPTION OF DRAWINGS

The invention will be better understood and features, aspects and advantages other than those set forth above will become apparent when consideration is given to the following detailed description thereof. Such detailed description makes reference to the following drawings.

FIG. 6 is a perspective view of a lockout assembly of the modular enclosure of FIG. 1.

FIG. 7 is an exploded view of the lockout assembly of FIG. 6.

DETAILED DESCRIPTION

Figure 1:
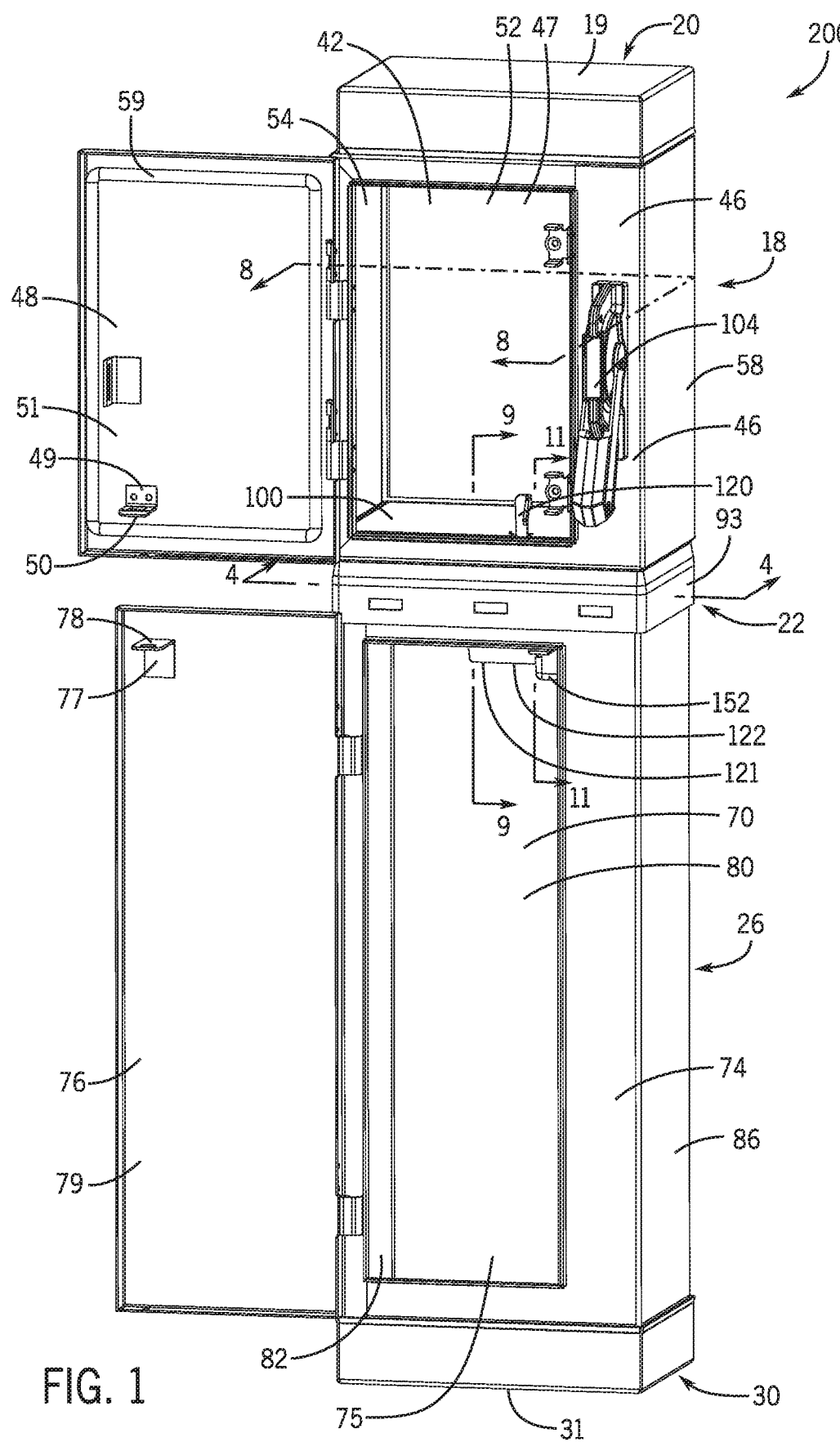
FIG. 1 is a perspective view of a modular enclosure according to one embodiment of the invention.

Before any embodiments of the invention are explained in detail, it is to be understood that the embodiments are not limited in its application to the details of construction and the arrangement of components set forth in the following description or illustrated in the following drawings. Aspects of the invention are capable of other embodiments and of being practiced or of being carried out in various ways. Also, it is to be understood that the use the phraseology and terminology used herein is for the purpose of description and should not be regarded as limiting. Furthermore, the use of "right", "left", "front", "back", "upper", "lower", "above", "below", "top", or "bottom" and variations thereof herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Disclosed herein is a modular enclosure which can include a door interlock and may be capable of providing arc flash protection features without compromising customizability. Such a modular enclosure can be capable of using common parts for different standards, allowing manufacturers and suppliers to carry smaller inventories and better utilize existing inventory.

The figures show embodiments of a modular enclosure 200 including a first enclosure and a second enclosure joined by a coupling section, wherein the first enclosure can be an upper enclosure 18 and the second enclosure can be a lower enclosure 26 oriented below the upper enclosure 18. It should be appreciated that, in other embodiments, the first enclosure and second enclosure can be oriented in a side-by-side configuration. For the purposes of clarity, the description will describe the modular enclosure 200 with the upper enclosure 18 and the lower enclosure 26.

Figure 18:
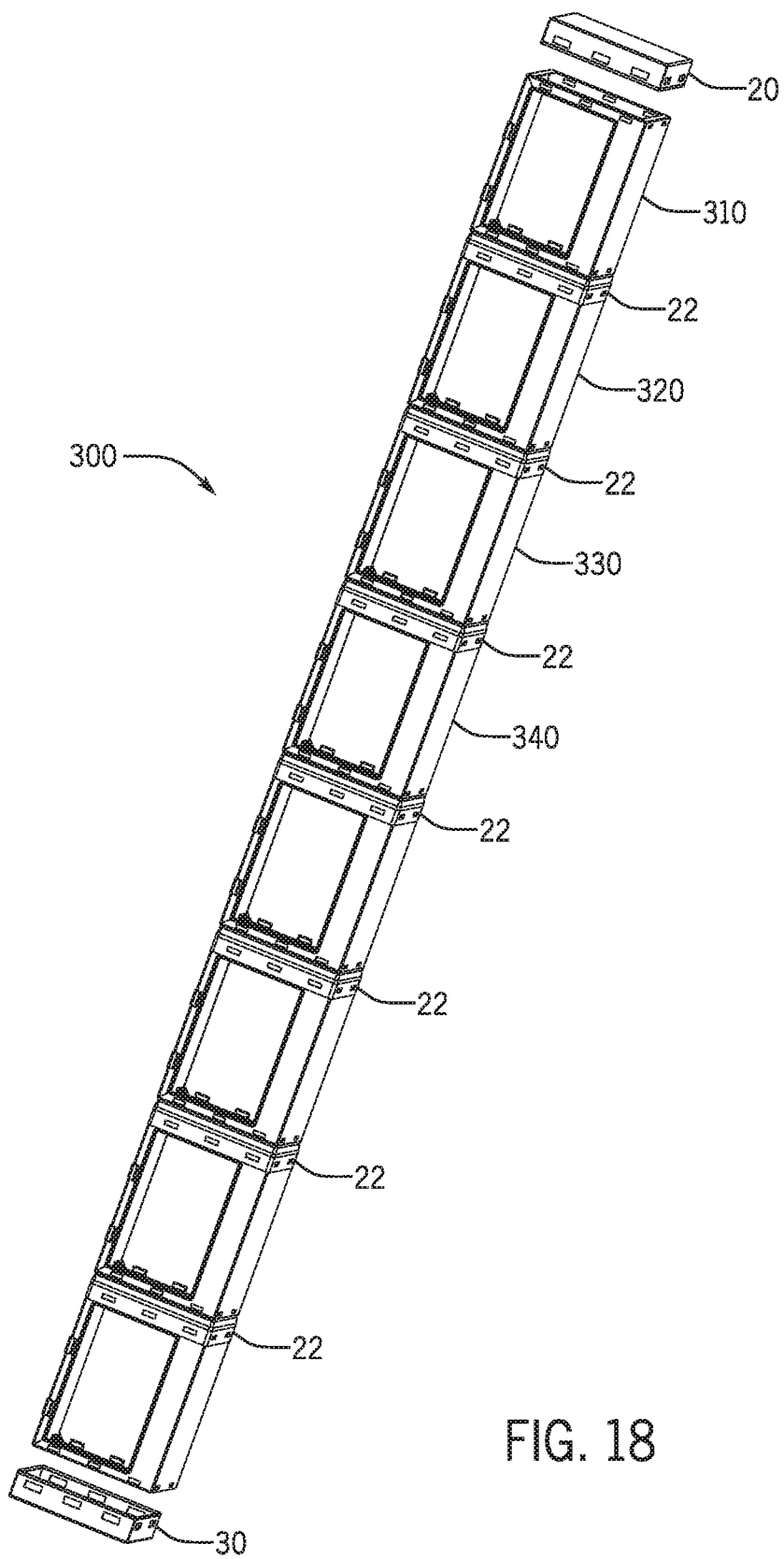
FIG. 18 is a perspective few of a modular enclosure with additional joined enclosures.

It should also be appreciated that, in other embodiments, the first enclosure can be joined to the second enclosure without the use of a coupling section. In some embodiment, at least one additional enclosures can be joined with the first enclosure and second enclosure with or without a coupling section. The additional enclosures may be the same or different than any of the first and second enclosures. As seen in FIG. 18, in one example, a modular enclosure 300 can include a first enclosure 310 can be joined with a second enclosure 320, with or without a coupling section 22, a third enclosure 330 can be joined to any of the first enclosure 310 and second enclosure 320, with or without a coupling section 22, and a fourth enclosure 340 can be joined with any of the first enclosure 310, second enclosure 320, and third enclosure 330, with or without a coupling section 340. The modular enclosure 300 can further include additional joined enclosures, as seen in FIG. 18, where modular enclosure 300 includes eight enclosures.

Figure 2:
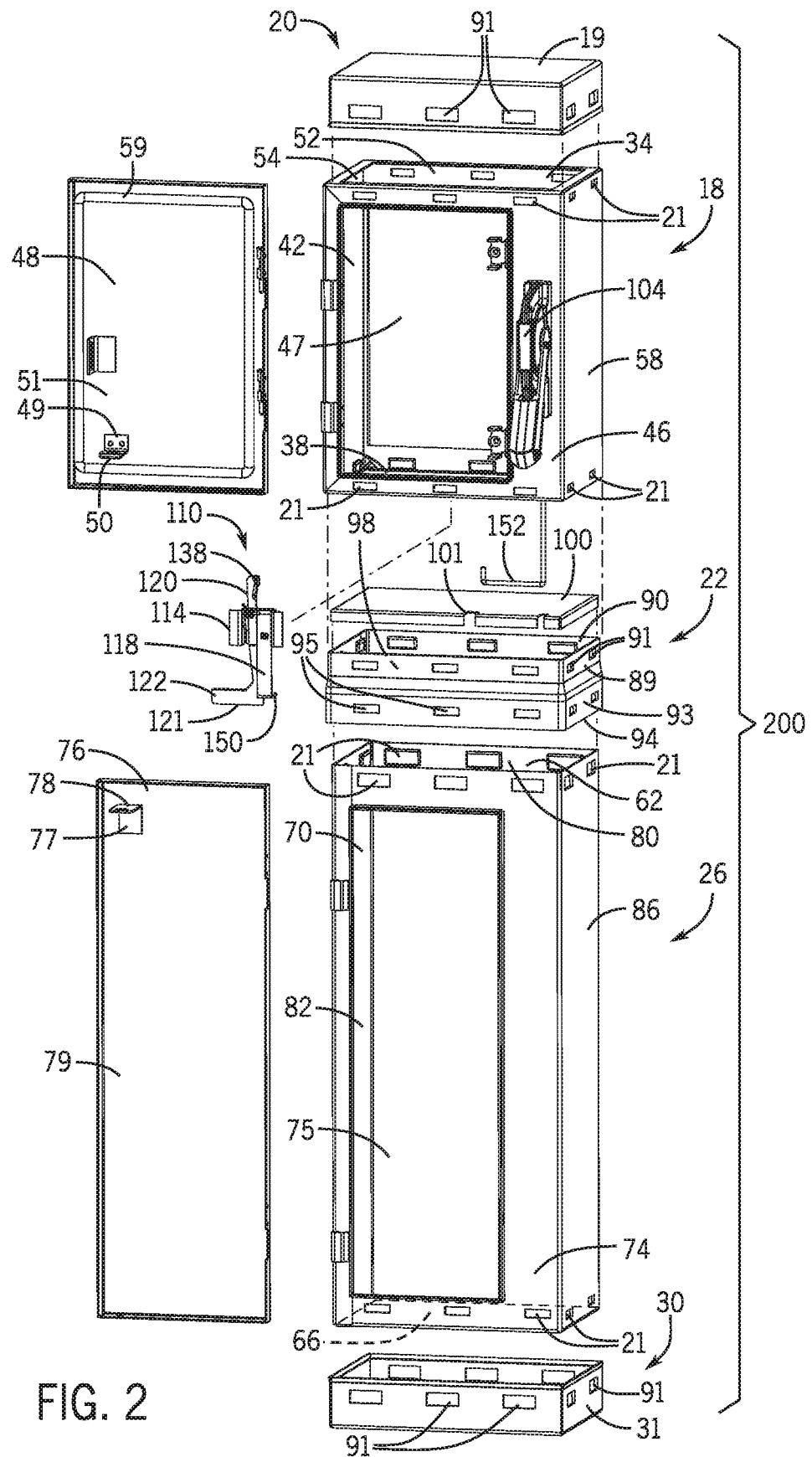
FIG. 2 is an exploded perspective view of the modular enclosure of FIG. 1.

FIG. 1 and FIG. 2 show a modular enclosure 200 including a top cap 20, the upper enclosure 18, a coupling section 22, the lower enclosure 26, and a bottom cap 30. Any of the top cap 20, the upper enclosure 18, the coupling section 22, the lower enclosure 26, and the bottom cap 30 can be fabricated from stainless steel, aluminum, plastic, an alternative steel alloy, or any suitable material. Furthermore, any of the top cap 20, the upper enclosure 18, the coupling section 22, the lower enclosure 26, and the bottom cap 30 could be cast using various casting methods, for example, die casting.

The upper enclosure 18 can define an upper enclosure top side aperture 34, an upper enclosure bottom side aperture 38, and an upper enclosure cavity 42, and can include an upper front side 46, an upper back side 52, an upper left side 54, and an upper right side 58. The upper front side 46 can define an upper door aperture 47 that may be covered by an upper door 48. The upper door 48 can be coupled to the upper front side 46. An upper door bracket 49 can be connected to or part of an upper door interior surface 51. The upper door bracket 49 can include an upper door bracket opening 50. In some embodiments, an upper door gasket 59 can be disposed on the upper front side 46 proximate to the upper door aperture 47 so that it can create a seal between the upper front side 46 and the upper door 48. In other embodiments, the upper door gasket 59 can be disposed around the periphery of the upper door interior surface 51 so that a seal is similarly formed. Electrical equipment (not shown) can be mounted within the upper enclosure cavity 42. Typically, the electrical equipment is mounted on the upper back side 52, however, in other embodiments, the electrical equipment may be mounted on other surfaces, such as a mounting plate (not shown), within the upper enclosure cavity 42.

The upper enclosure 18 can also include and a plurality of enclosure interlocking features 21. The enclosure interlocking features 21 can be arranged on any of the upper front side 46, the upper back side 52, the upper left side 54, and the upper right side 58 at a longitudinal distance from the upper enclosure top side aperture 34 or the upper enclosure bottom side aperture 38. In some embodiments, the upper left side 54 and the upper right side 58 can include two top enclosure interlocking features 21 and the upper back side 52 can include three enclosure interlocking features 21, with all the enclosure interlocking features 21 at an equal longitudinal distance from either the upper enclosure top side aperture 34 or the upper enclosure bottom side aperture 38. The quantity and arrangement of the enclosure interlocking features 21 may be different in other embodiments. For example, one or more of the enclosure interlocking features 21 could be arranged on the upper front side 46, the upper back side 52, the upper left side 54, and/or the upper right side 58. Alternatively, either the upper front side 46, the upper back side 52, the upper left side 54, or the upper right side 58 could include one or more of the enclosure interlocking features 21. Furthermore, the longitudinal distance from the upper enclosure top side aperture 34 or the upper enclosure bottom side aperture 38 to the enclosure interlocking features 21 may be different for one or more of the enclosure interlocking features 21.

The upper enclosure can further include a power handle 104 mounted on the upper front side 46. The power handle 104 can be togglable between an "ON" position and an "OFF" position, as shown, and can be configured to control one or more power disconnect switches (not shown) housed within the upper enclosure cavity 42. The power disconnect switches can be configured to control the supply of power to the lower enclosure 26. The power disconnect switches can be configured so that when the power handle 104 is in the "ON" position power is supplied to the lower enclosure 26, and when the power handle 104 is in the "OFF" position power is not supplied to the lower enclosure 26.

The top cap 20 can be configured to seal the upper enclosure top side aperture 34, and can include a top cap plate 19, which may be dimensioned to cover the upper enclosure top side aperture 34, and a top cap gasket (not shown) disposed on the top cap 20 so that a seal between the top cap 20 and the upper enclosure 18 is formed. In another embodiment, the top cap gasket can be disposed on the upper enclosure 18 proximate to the upper enclosure top side aperture 34 so that a seal is formed between the top cap 20 and the upper enclosure 18.

With continued reference to FIG. 1 and FIG. 2, the lower enclosure 26 can define a lower enclosure top side aperture 62, a lower enclosure bottom side aperture 66, and a lower enclosure cavity 70, and can include a lower front side 74, a lower back side 80, a lower left side 82, and a lower right side 86. The lower front side 74 can define a lower door aperture 75 that may be covered by a lower door 76. The lower door 76 can be coupled to the lower front side 74. A lower door bracket 77 can be connected to or part of a lower door interior surface 79. The lower door bracket 77 can include a lower door bracket opening 78. In some embodiments, a lower door gasket (not shown) can be disposed on the lower front side 74 proximate to the lower door aperture 75 so that it can create a seal between the lower front side 74 and the lower door 76. In other embodiments, the lower door gasket can be disposed around the periphery of the lower door interior surface 79 so that a seal is similarly formed. Electrical equipment (not shown) can also be mounted within the lower enclosure cavity 70 on the lower back side 80, or on any other surfaces, such as a mounting plate (not shown), within the lower enclosure cavity 70.

As with the upper enclosure 18, the lower enclosure 26 can also include and a plurality of enclosure interlocking features 21. The enclosure interlocking features 21 can be arranged on any of the lower front side 74, the lower back side 80, the lower left side 82, and the lower right side 86 at a longitudinal distance from the lower enclosure top side aperture 62 or the lower enclosure bottom side aperture 66. In some embodiments, the lower left side 82 and the lower right side 86 can include two enclosure interlocking features 21 and the lower back side 80 can include three enclosure interlocking features 21, with all the enclosure interlocking features 21 at an equal longitudinal distance from the either lower enclosure top side aperture 62 or the lower enclosure bottom side aperture 66. The quantity and arrangement of the enclosure interlocking features 21 may be different in other embodiments. For example, one or more of the enclosure interlocking features 21 could be arranged on the lower front side 74, the lower back side 80, the lower left side 82, and/or the lower right side 86. Alternatively, either the lower front side 74 and the lower back side 80, or the lower left side 82 and the lower right side 86 could include one or more of the enclosure interlocking features 21. Furthermore, the longitudinal distance from the lower enclosure top side aperture 62 or the lower enclosure bottom side aperture 66 to the enclosure interlocking features 21 may be different for one or more of the enclosure interlocking features 21.

In some non-limiting embodiments, the lower enclosure 26 can include the power handle 104, which may be mounted on the lower front side 74. Here, the power handle 104 can be togglable between an "ON" position and an "OFF" positon, and can be configured to control one or more power disconnect switches (not shown) housed within the lower enclosure cavity 70.

The bottom cap 30 can be configured to seal the lower enclosure bottom side aperture 66, and can include a bottom cap plate 31, which may be dimensioned to cover the lower enclosure bottom side aperture 66, and a bottom cap gasket (not shown) disposed on the bottom cap 30 so that a seal between the bottom cap 30 and the lower enclosure 26 is formed. In another embodiment, the bottom cap gasket can be disposed on the lower enclosure 26 proximate to the lower enclosure bottom side aperture 66 so that a seal is formed between the bottom cap 30 and the lower enclosure 26.

Figure 3:
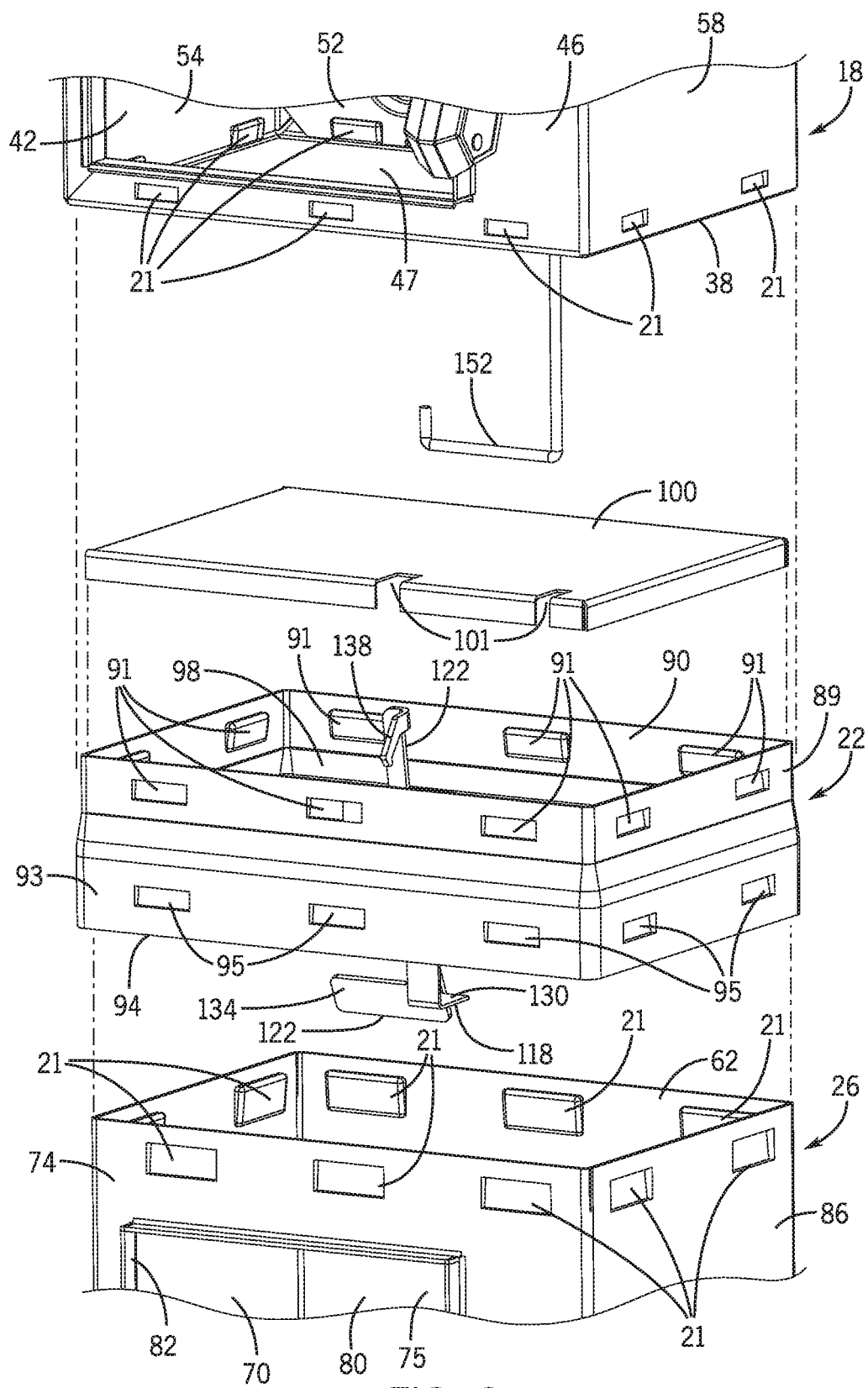
FIG. 3 is an enlarged view of a portion of a coupling section with an upper enclosure and a lower enclosure of the modular enclosure of FIG. 2.
Figure 4:
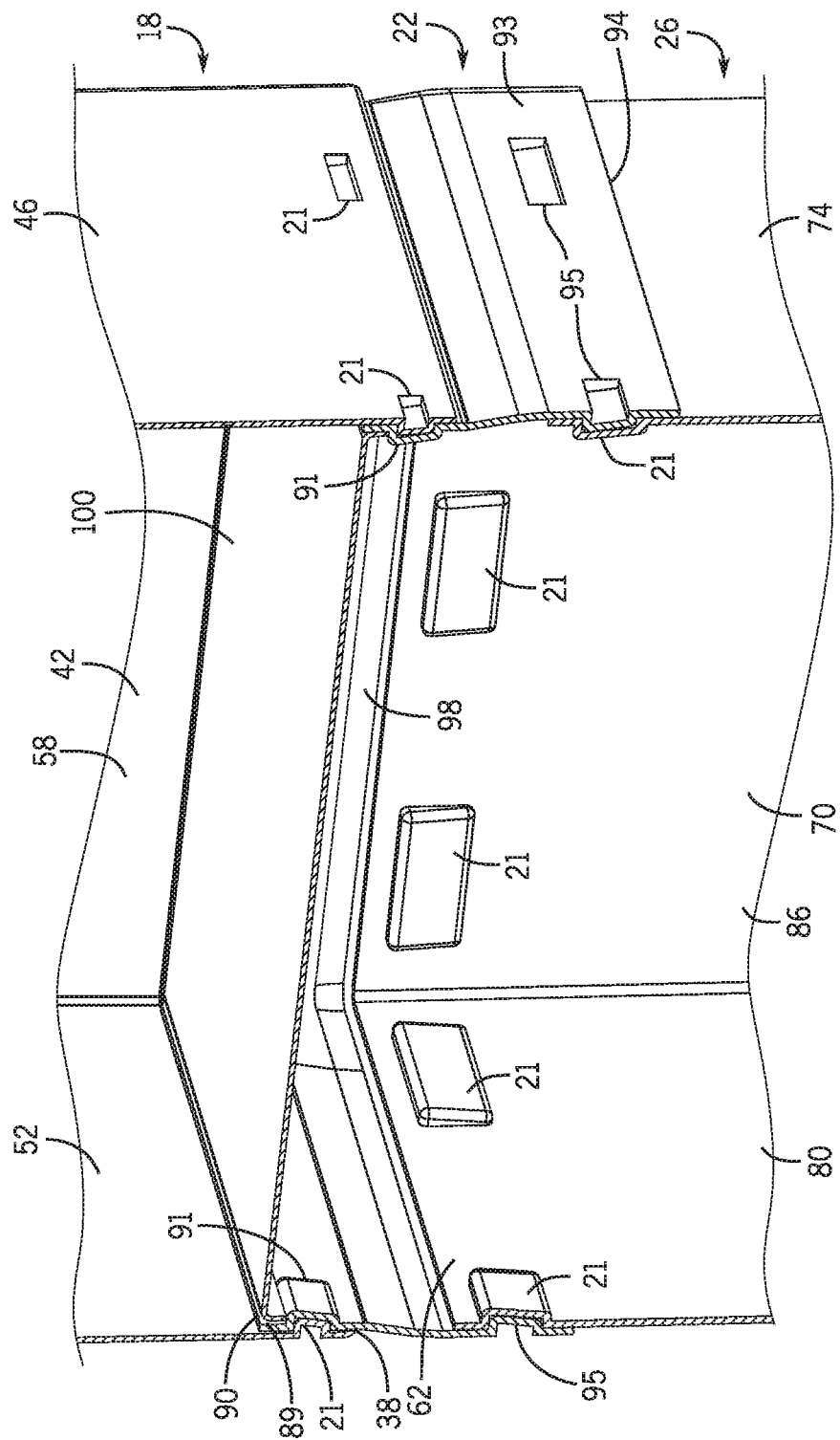
FIG. 4 is a section view of a coupling section of the modular enclosure with the upper enclosure and the lower enclosure of the modular enclosure of FIG. 1 taken along line 4-4.

The enclosure interlocking features 21 included on the upper enclosure 18 or the lower enclosure 26, can define an inclined indent, shown in more detail in FIGS. 3-4. The enclosure interlocking features 21 could define a different indent in other embodiments. For example, enclosure interlocking features 21 could define an elliptical indent, or a quadrilateral indent. The enclosure interlocking features 21 can be integrated into the upper enclosure 18 or the lower enclosure 26 using a punching technique, where a pre-formed punch is used to form a protrusion at a desired location for the enclosure interlocking features 21. Alternatively, the enclosure interlocking features 21 could be individually pre-formed parts and attached to the upper enclosure 18 or the lower enclosure 26 using a welding technique, or any suitable attachment means. The enclosure interlocking features 21 could be formed into the upper enclosure 18 or the lower enclosure 26 before or after the upper enclosure 18 or the lower enclosure 26 is formed.

It should be appreciated that in an embodiment of the modular enclosure having a side-by-side configuration, the top cap 20 and the bottom cap 30 can be a first cap and a second cap, respectively. The first cap can be configured to seal a first enclosure aperture and the second cap can be configured to seal a second enclosure aperture. In some embodiments, the first cap and the second cap may be interchangeable.

Looking now to FIG. 3 and FIG. 4, the coupling section 22 can include a coupling section top portion 89 defining a coupling section top side aperture 90, and a coupling section bottom portion 93 defining coupling section bottom side aperture 94. The coupling section 22 can also define a coupling section cavity 98. The coupling section cavity 98 can be configured to provide a pathway from the coupling section top side aperture 90 to the coupling section bottom side aperture 94. The pathway can further provide access from the upper enclosure cavity 42 to the lower enclosure cavity 70.

The coupling section bottom portion 93 can be dimensioned so that a portion of the lower enclosure 26 may be received in the coupling section cavity 98 through the coupling section bottom side aperture 94. The coupling section top portion 89 can be sized so that it may be received within the upper enclosure cavity 42 through the upper enclosure bottom side aperture 38. The coupling section 22 can be tapered from the larger coupling section bottom portion 93 to the smaller coupling section top portion 89.

In another embodiment, the coupling section bottom portion 93 can be dimensioned so that it can be received within the lower enclosure cavity 70 through the lower enclosure top side aperture 62. The coupling section top portion 89 can be sized so that a portion of the upper enclosure 18 may be received in the coupling section cavity 98 through the coupling section top side aperture 90.

In some embodiments, the coupling section 22 can include a plurality of interior coupling features 91 disposed on the coupling section top portion 89 and a plurality of exterior coupling features 95 disposed on the coupling section bottom portion 93. In some embodiments, interior coupling features 91 can be disposed on the coupling section bottom portion 93 and a plurality of exterior coupling features 95 can be disposed on the coupling section top portion 89. The quantity and arrangement of the interior coupling features 91 may be different than the quantity and arrangement of the exterior coupling features 95. The interior coupling features 91 and the exterior coupling features 95 can define an inclined protrusion, shown in cross-section. The interior coupling features 91 or the exterior coupling features 95 can also define a different protrusion in other embodiments. For example, the interior coupling features 91 or the exterior coupling features 95 could define an elliptical protrusion, or a quadrilateral protrusion. The interior coupling features 91 or the exterior coupling features 95 can be integrated into the coupling section 22 using a punching technique, where a pre-formed punch is used to form a protrusion in the coupling section 22 at a desired location for the interior coupling features 91 or the exterior coupling features 95. Alternatively, the interior coupling features 91 or the exterior coupling features 95 could be individually pre-formed parts and attached to the coupling section using a welding technique, or any suitable attachment means. The interior coupling features 91 or the exterior coupling features 95 could be formed into the coupling section 22 before or after the coupling section 22 is formed.

The interior coupling features 91 and the exterior coupling features 95 can be configured to interlock with a corresponding enclosure interlocking feature 21 on the upper enclosure 18 or the lower enclosure 26. In some embodiments, the inclined protrusion of the interior coupling features 91 or the exterior coupling features 95 can engage the inclined indent of the enclosure interlocking features 21 of the upper enclosure 18 or the lower enclosure 26, or both, inhibiting the coupling section 22 from displacing relative to the upper enclosure 18 or the lower enclosure 26, thereby interlocking the coupling section and the upper enclosure 18 or the lower enclosure 26. In some embodiments, all of the interior coupling features 91 or the exterior coupling features 95 would be in engagement with the corresponding enclosure interlocking features 21 on the upper enclosure 18 or the lower enclosure 26. However, for the coupling section 22 to be interlocked to the upper enclosure 18 or the lower enclosure 26, only two of the interior coupling features 91 or the exterior coupling features 95 need to engage two of the corresponding enclosure interlocking features 21 on the upper enclosure 18 or the lower enclosure 26.

Similar interlocking features may be used to couple different components of the modular enclosure. For example, interior interlocking features 91 may be included in the top cap 14 or bottom cap 30 and can couple the top cap 14 or bottom cap 30 to the upper enclosure 18 or the lower enclosure 26 (see FIG. 2). In some embodiments, interlocking features may be used to couple the first enclosure directly to the second enclosure.

In other non-limiting embodiments, the coupling section 22 can be connected to the upper enclosure 18 and the lower enclosure 26 using glues, gaskets, welding techniques, one or more bolts, one or more rivets, or any suitable attachment means.

Figure 5:
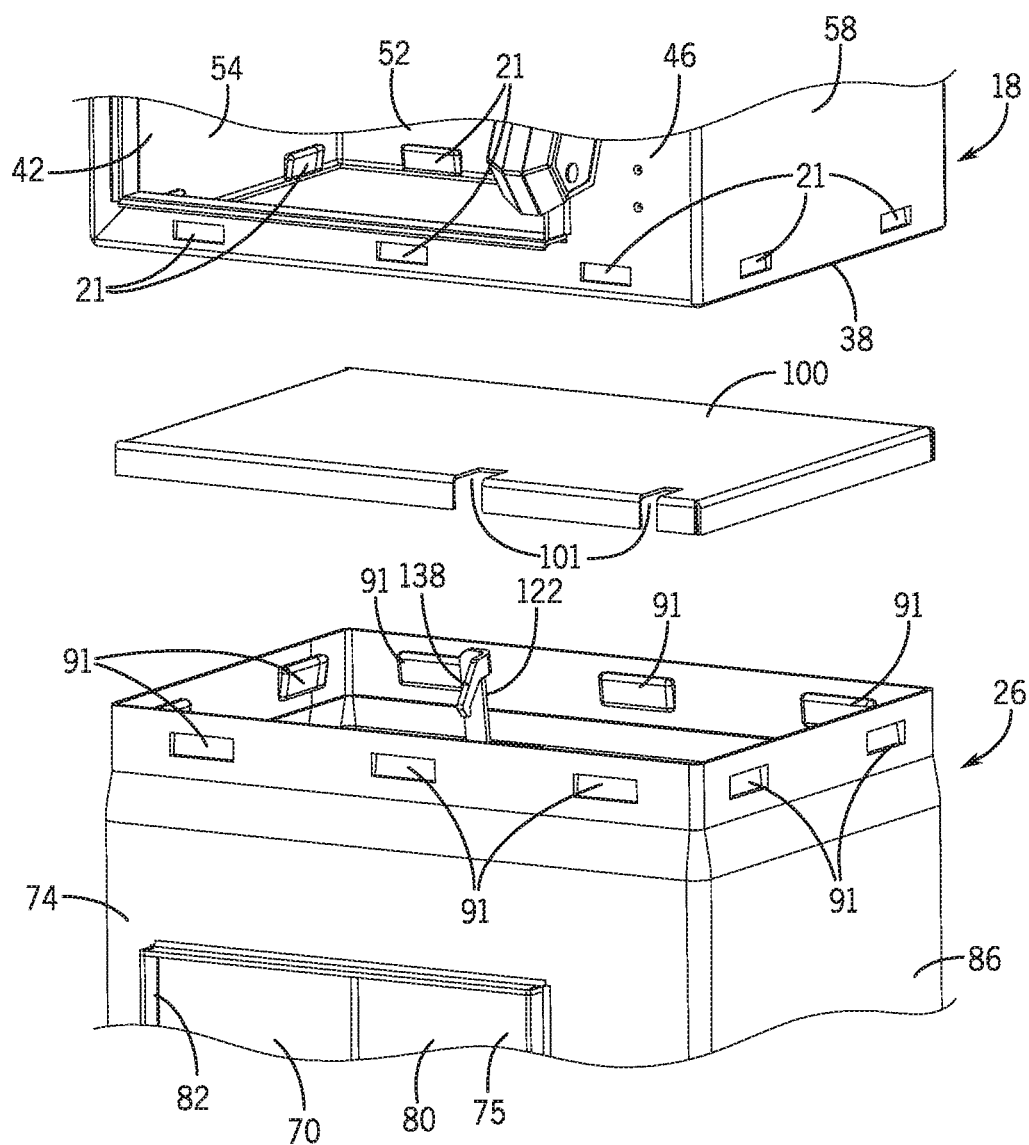
FIG. 5 is a perspective view of a modular enclosure which does not include a coupling section for coupling enclosures.

In some embodiments, one or more features of the coupling section 22 can be integrated into the upper enclosure 18 or the lower enclosure 26, as shown in FIG. 5. The features of the coupling section 22 may be integrated into an upper enclosure or a lower enclosure alone, or they may be split between the two enclosures. In the illustrated embodiment, the coupling section 22 has been integrated into the lower enclosure, however other configurations are also possible. In other embodiments, an upper enclosure and a lower enclosure may be coupled directly to each other and a coupling section is not needed.

Figure 8:
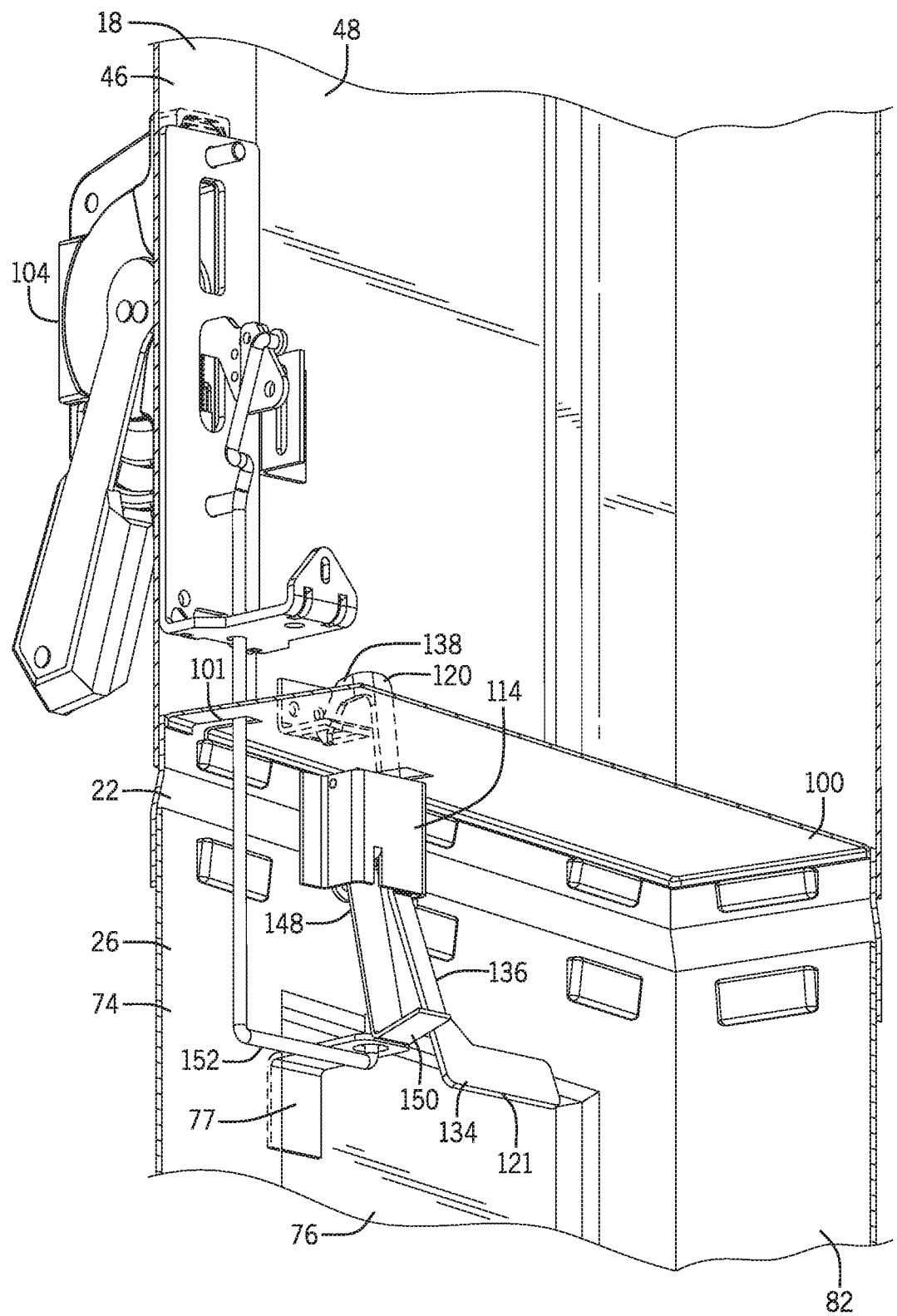
FIG. 8 is a perspective section view of the modular enclosure of FIG. 1 taken along line 8-8.

FIGS. 6-8 show a lockout assembly 110 which can be configured to prevent the upper door 48 or the lower door 76 (see FIG. 1) from being opened while the power handle 104 is in the "ON" position. The lockout assembly 110 can further prevent the power handle 104 from being toggled into the "ON" position while the lower door is open. The lockout assembly 110 can include a slam catch mechanism 119 configured to lock the upper door 48 in a "CLOSED" position until the slam catch mechanism 119 is actuated from within the lower enclosure cavity 70.

The lockout assembly 110 can include a lower door lockout bar 118 and a slam catch mechanism 119, such as a slam catch bar 122, both being rotatably connected to a lockout base 114 by a pin 111 or any other suitable connection means. A compression spring 112 and a torsion spring 113 can be configured to bias the lower door lockout bar 118 and slam catch bar 122, respectively, to a "LOCKED" position. The lockout base 114 can include a back plate 126, a left lockout wall 128, and a right lockout wall 130. The left lockout wall 128 and right lockout wall 130 can be on or near the left and right edges of the back plate 126 and both can extend outwardly from the back plate 126. The left lockout wall 128 and right lockout wall 130 can respectively have a left housing pin hole 129 and a right housing pin hole 131, both sized to receive the pin 111 and oriented concentrically with each other. The back plate 126 can be dimensioned so that the horizontal distance between the left lockout wall 128 and right lockout wall 130 is at least wide enough to receive the lower door lockout bar 118 and slam catch bar 122 between the left lockout wall 128 and right lockout wall 130.

The slam catch bar 122 can have a slam catch extension 136, including a release handle 134 at or near the lower end of a slam catch extension 136, and a latch 138 at or near the upper end of the slam catch extension 136. A left slam catch pivot 140 and a right slam catch pivot 142 can be attached to the slam catch extension 136 in-between the upper end and lower end, and can extend outwardly from the slam catch extension 136. The left slam catch pivot 140 and right slam catch pivot 142 can be respectively connected on or near a left and right edge of the slam catch extension 136. The left slam catch pivot 140 and right slam catch pivot 142 can further include a left slam catch pin hole 141 and right slam catch pin hole 143, respectively. The left slam catch pin hole 141 and right slam catch pin hole 143 can be oriented concentrically and can be sized to receive the pin 111 so that the slam catch bar 122 can rotate about the pin 111. The width of the slam catch extension 136 can be sized so that the torsion spring 113 fits in-between the left slam catch pivot 140 and right slam catch pivot 142. The torsional spring 133 can have an inner diameter at least large enough to receive the pin 111, and can be mounted on the pin 111 in between the left slam catch pivot 140 and right slam catch pivot 142 of the slam catch bar 122.

The lower door lockout bar 118 can include a lockout bar pivot 146 attached to the upper end of a lockout bar extension 148. The lockout bar extension 148 can extend downwardly to a blocking portion 150 at or near the lower end of the lockout bar extension 148. The lockout bar pivot 146 can include a lockout bar pin hole 147 sized to receive the pin 111 so that the lower door lockout bar 118 can rotate about the pin 111.

The slam catch bar 122 and lower door lockout bar 118 can be oriented in-between the left lockout wall 128 and right lockout wall 130 of the lockout base 114 so that the pin 111 can extend from the left housing pin hole 129, through the left slam catch pin hole 141 and right slam catch pin hole 143, as well as through the opening of the torsion spring 113 mounted between left slam catch pivot 140 and right slam catch pivot 142, through the lockout bar pin hole 147, and to the right housing pin hole 131. The compression spring 112 can be disposed on the lockout base 114 between the back plate 126 and the lower door lockout bar 118, and can be configured to bias the lower door lockout bar 118 away from the back plate 126. The lockout base 114 can further include a spring positioning tab 115 configured to position the compression spring 112. The torsion spring 113 can be configured to bias the release handle 134 of the slam catch bar 122 backwards and in the direction of the back plate 126.

In one embodiment, the lockout assembly 110 can be connected to the coupling section 22 inside the coupling section cavity 98 (see FIG. 8). In other embodiments, the lockout assembly 110 can be connected to the upper enclosure 18 or the lower enclosure 26, or a combination of both.

Figure 9:
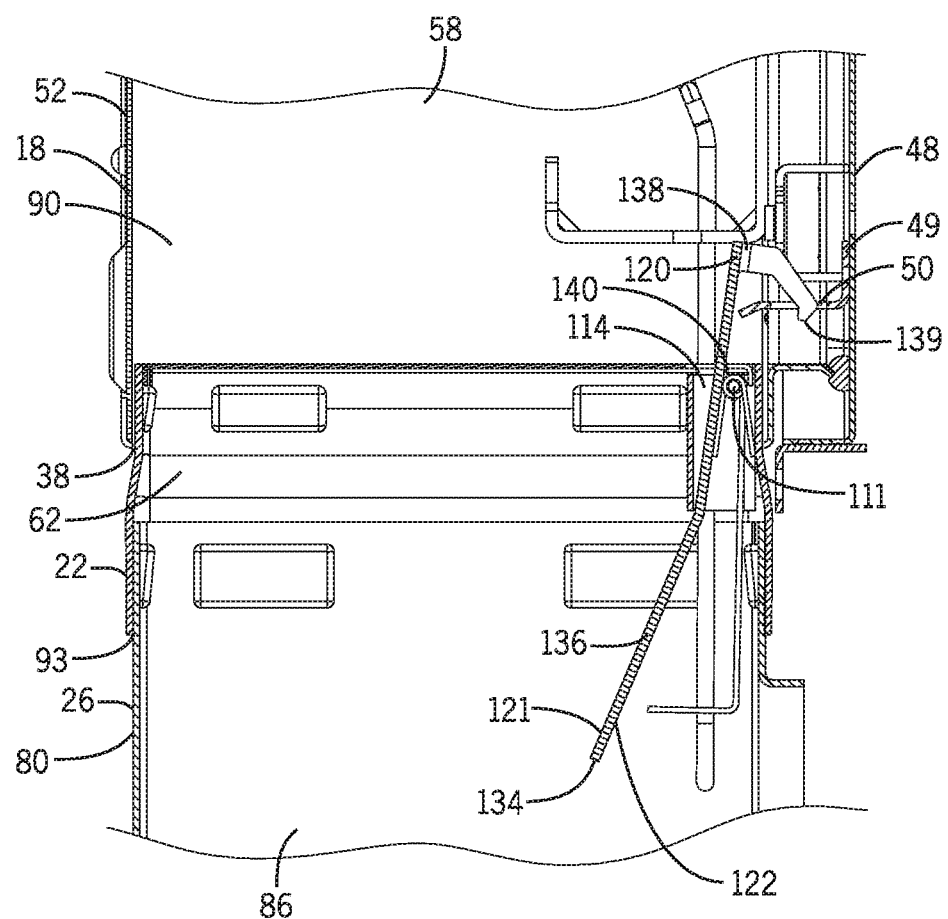
FIG. 9 is a section view of the modular enclosure of FIG. 1 taken along line 9-9 with a slam catch bar in a "LOCKED" position.
Figure 10:
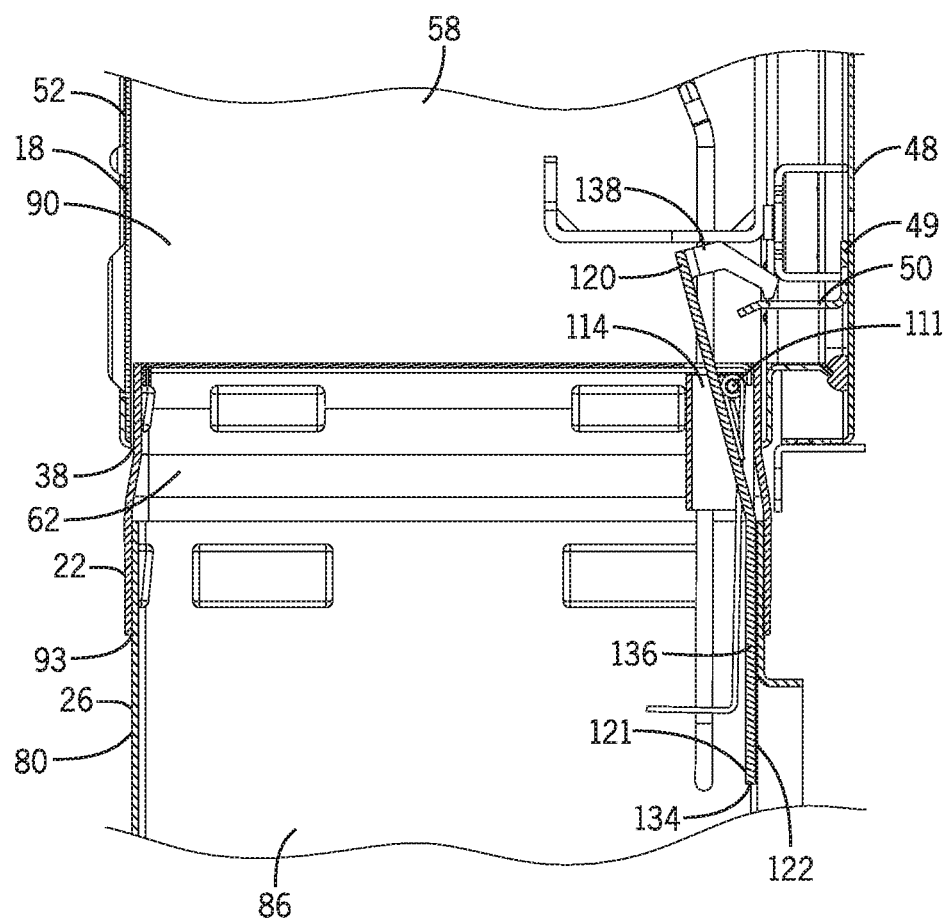
FIG. 10 is the section view of the modular enclosure of FIG. 1 taken along line 9-9 with a slam catch bar in an "UNLOCKED" position.
Figure 11:
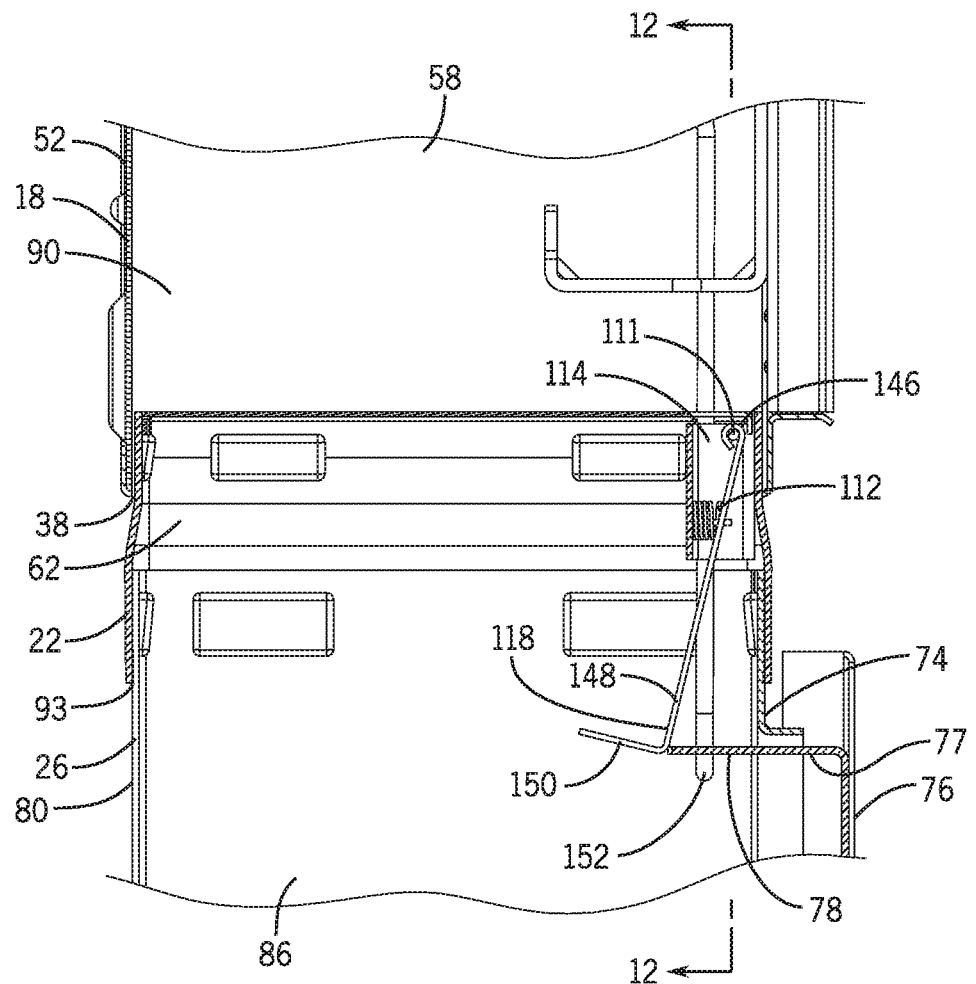
FIG. 11 is a section view of the modular enclosure of FIG. 1 taken along line 11-11 with a power handle in the "ON" position and a lower door in the "CLOSED" position.
Figure 12:
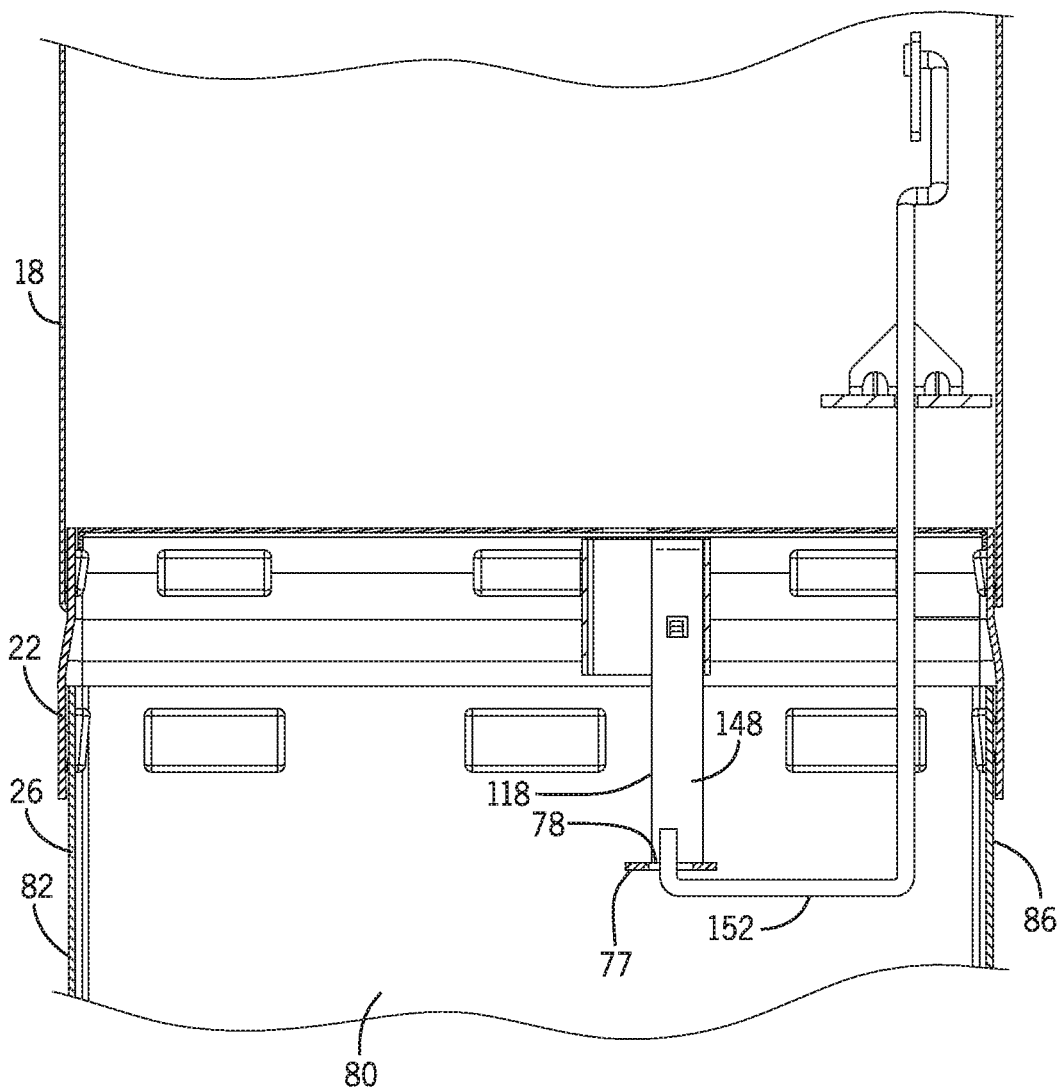
FIG. 12 is a section view of the modular enclosure of FIG. 11 taken along line 12-12 with the power handle in the "ON" position and the lower door in the "CLOSED" position.
Figure 13:
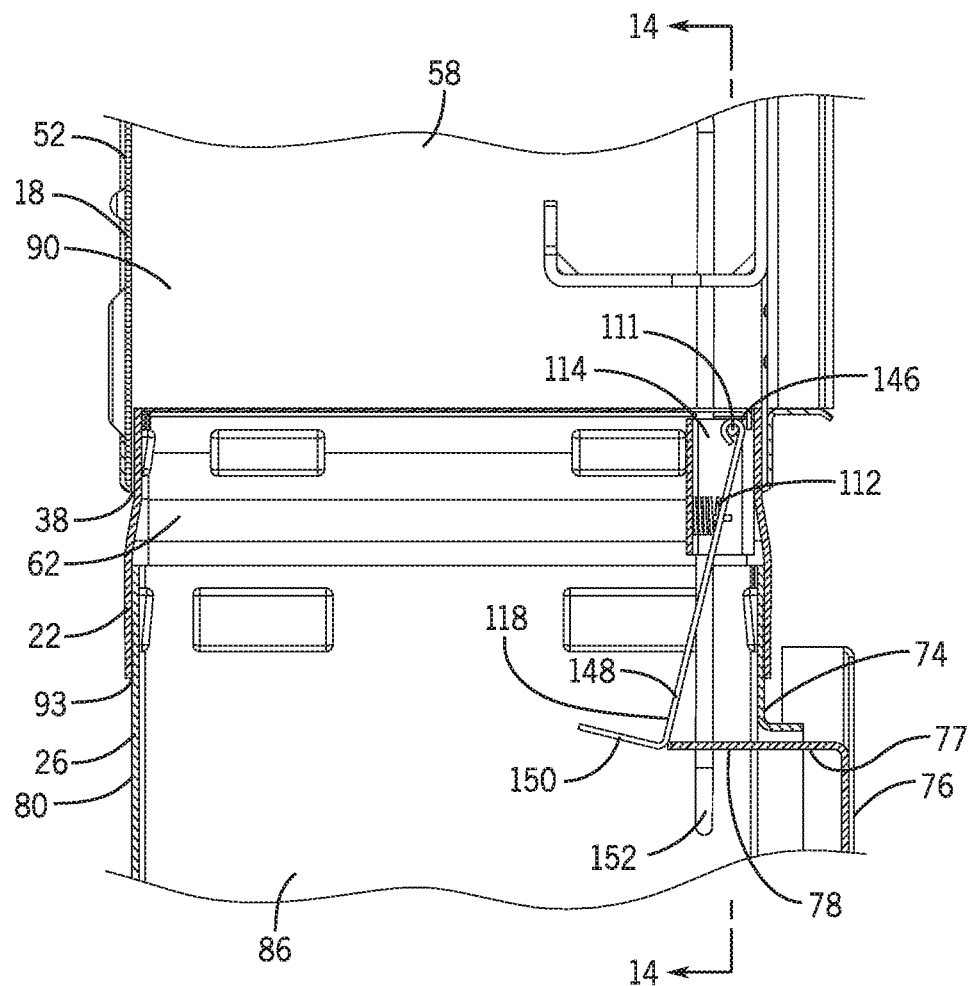
FIG. 13 is a section view of the modular enclosure of FIG. 1 taken along line 11-11 with the power handle in the "OFF" position and the lower door in the "CLOSED" position.
Figure 14:
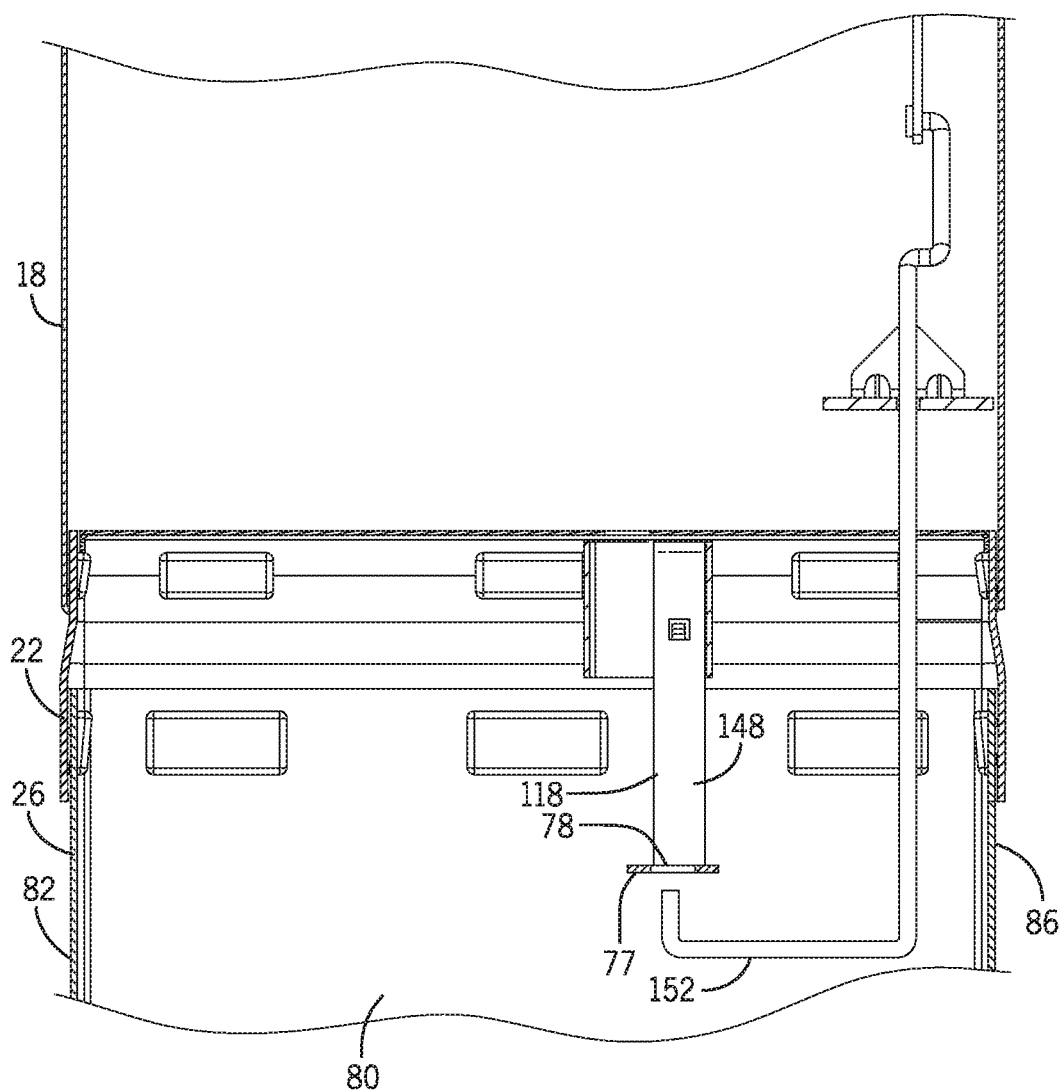
FIG. 14 is a section view of the modular enclosure of FIG. 13 taken along line 14-14 with the power handle in the "OFF" position and the lower door in the "CLOSED" position.
Figure 15:
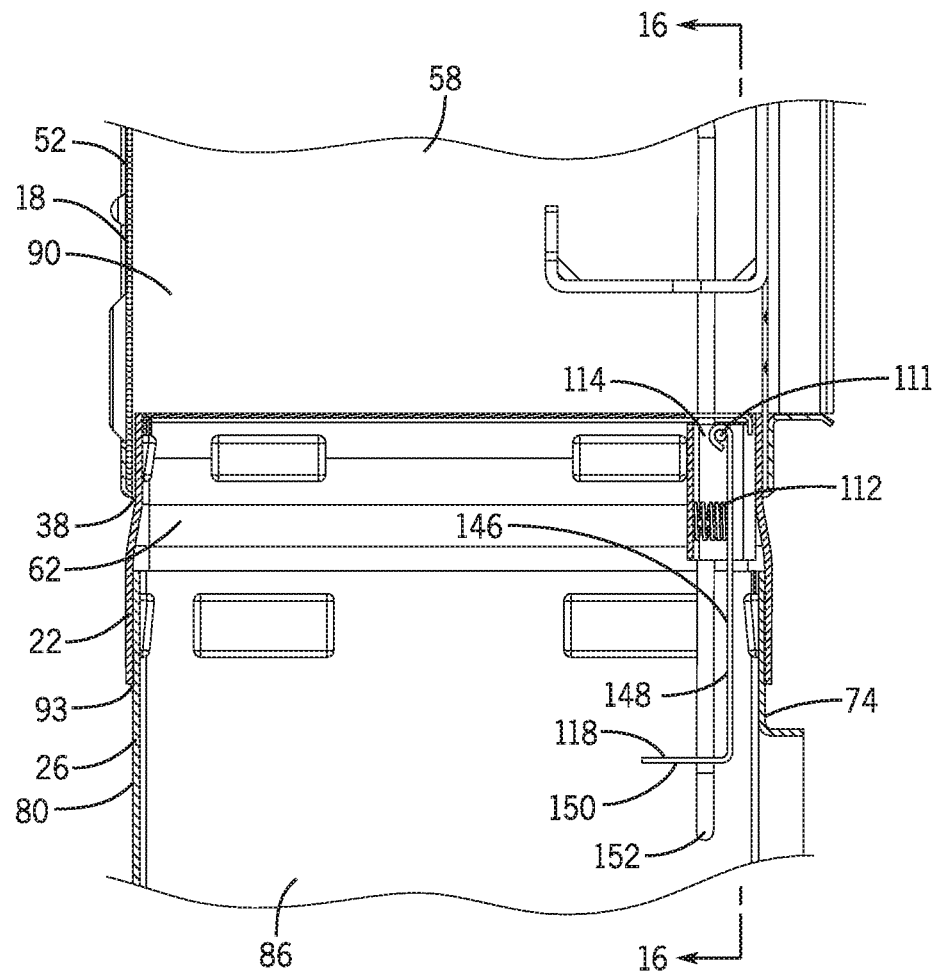
FIG. 15 is a section view of the modular enclosure of FIG. 1 taken along line 11-11 with the power handle in the "OFF" position and the lower door in the "OPEN" position.
Figure 16:
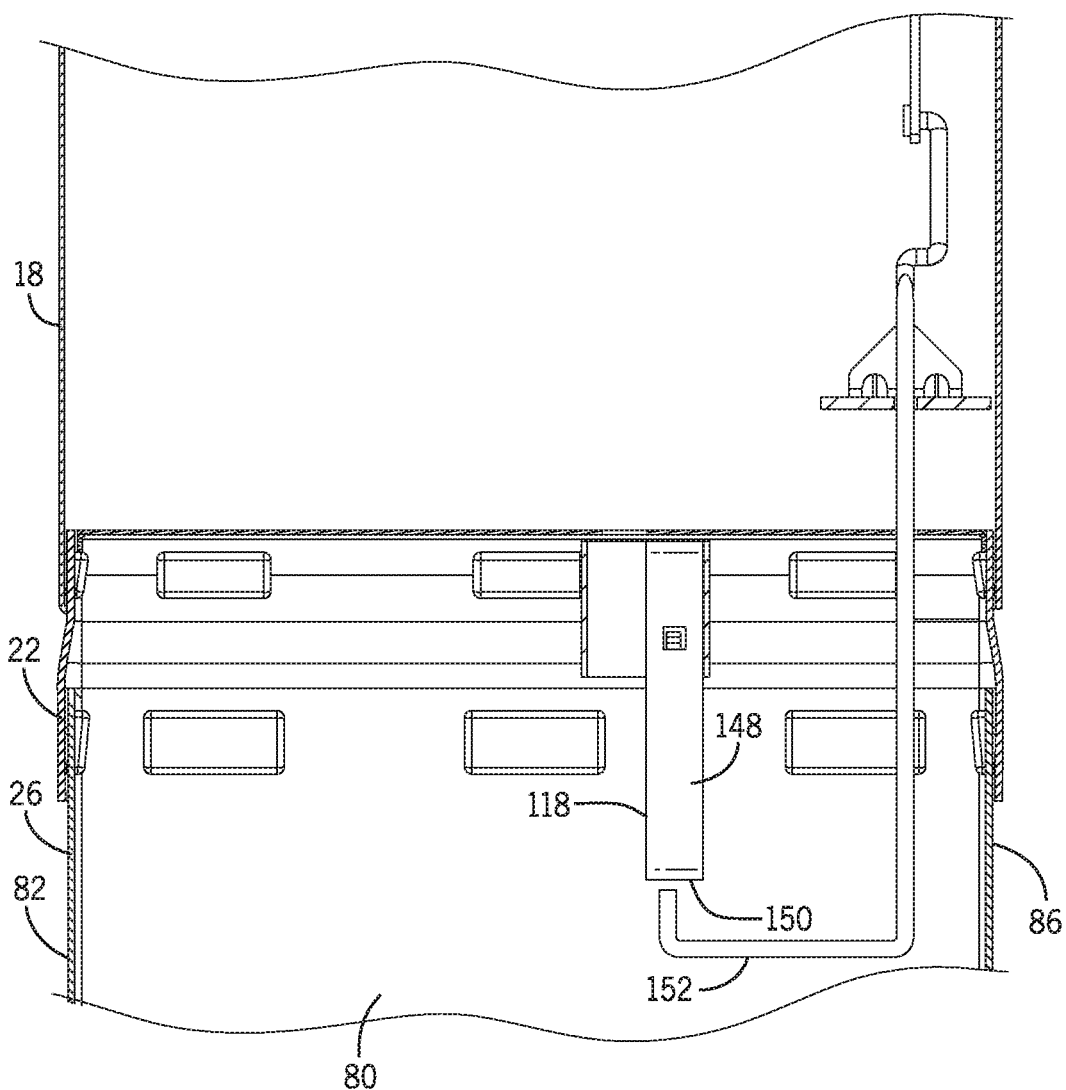
FIG. 16 is a section view of the modular enclosure of FIG. 15 taken along line 16-16 with the power handle in the "OFF" position and the lower door in the "OPEN" position.

Looking to FIG. 9 and FIG. 10, operating positions of the slam catch bar 122 are shown. The slam catch bar 122 can extend upward into the upper enclosure cavity 42, and can be configured so that the latch 138 engages the upper door bracket opening 50. The release handle 134 can protrude downward into the lower enclosure cavity 70. When the upper door bracket opening 50 is engaged by the latch 138, the upper door 48 can be held in a "CLOSED" position and cannot be opened (see FIG. 9). A user may pull the release handle 134 of the slam catch bar 122 toward the lower front side 74, rotating the slam catch bar 122 about the pin 111 into an "UNLOCKED" position. When moved into the "UNLOCKED" position, the latch 138 is lifted out of, and away, from the upper door bracket 49, disengaging the upper door bracket opening 50 (see FIG. 10). Once the upper door bracket opening 50 is disengaged, the user may move the upper door 48 into an "OPEN" position, granting access to the upper enclosure cavity 42. When released by the user, the slam catch bar 122 can be biased back into a "LOCKED" position by the torsion spring 133. If the user attempts to close the upper door 48 while the slam catch bar 122 is in the "LOCKED" position, the upper door bracket 49 can contact a lifting surface 139 of the latch 138, forcing the latch 138 upward. Once the upper door 48 is returned to the "CLOSED" position, slam catch bar 122 can be biased back into the "LOCKED" position, re-engaging the upper door bracket opening 50 with the latch 138 (see FIG. 9).

Referring to FIGS. 11-16, the operation of the lower door lockout bar 118 is shown from two perspectives. An interlock rod 152 can be linked to the power handle 104, and can extend from the upper enclosure cavity 42, down through the coupling section cavity 98, and into the lower enclosure cavity 70. The lower door lockout bar 118 can also extend downward into the lower enclosure cavity 70. When the lower door 76 is in a "CLOSED" position, and the power handle 104 is in the "ON" position, the interlock rod 152 can engage the lower door bracket opening 78. When the lower door bracket opening 78 is engaged by the interlock rod 152, the lower door 76 can be held in a "CLOSED" position and cannot be opened (see FIGS. 11 and 12). When the power handle 104 is moved to the "OFF" position, the interlock rod 152 can be moved so that the lower door bracket opening 78 is disengaged by the interlock rod 152. Once the lower door bracket opening 78 is disengaged, the user may move the lower door 76 into an "OPEN" position, granting access to the lower enclosure cavity 70 (see FIGS. 13 and 14). When the lower door 76 is moved into the "OPEN" position by the user, the lower door lockout bar 118 can be biased into an "OPENED" position by the compression spring 112. In the "OPENED" position, the blocking portion 150 of the lower door lockout bar 118 can block the movement of the interlock rod 152, preventing the power handle 104 from being moved into the "ON" position (see FIGS. 15 and 16). When the lower door 76 is moved into the "CLOSED" position by the user, the lower door bracket 77 can push the lower door lockout bar 118 back into the lower enclosure cavity 70, rotating it about the pin 111 into the "CLOSED" position (see FIGS. 13 and 14). In the "CLOSED" position, the lower door lockout bar 118 does not block the movement of the interlock rod 152 and the power handle 104 may be moved into the "ON" position.

The modular enclosure 200 can further include a gland plate 100 (see FIGS. 1-5, 8-14) connected to at least one of the upper enclosure 18, the lower enclosure 26, and the coupling section 22. The gland plate 100 can be configured to provide compartmentalization between the upper enclosure 18 and the lower enclosure 26, and to provide arc flash protection for the modular enclosure 200. The gland plate 100 can also be configured to completely or partially electrically isolate electrical equipment in the upper enclosure cavity 42 from electrical equipment in the lower enclosure cavity 70.

In some embodiments, the gland plate 100 can be configured to restrict the pathway from the upper enclosure cavity 42 to the lower enclosure cavity 70. The gland plate may include one or more gland plate apertures 101 configured to allow partial access through the gland plate 100. The one or more gland plate apertures 101 can be dimensioned and oriented to provide access through the gland plate 100 for at least one of the interlock rod 152 and a portion of the lockout assembly 110. In other embodiments, the one or more gland plate apertures 101 can provides access through the gland plate 100 to other electrical components (not shown) or any other parts of the modular enclosure 200.

Figure 17:
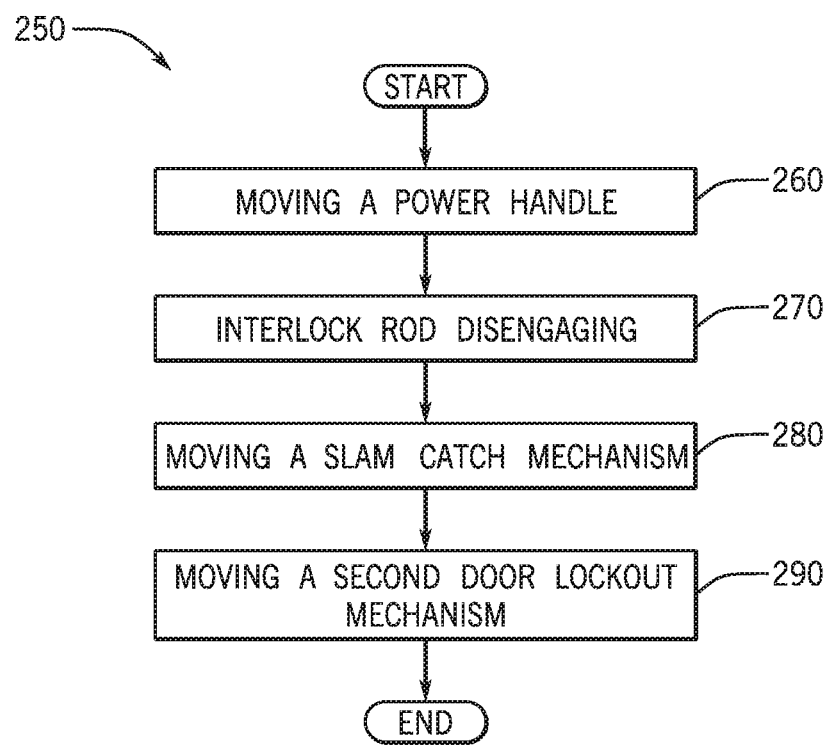
FIG. 17 is a block diagram of a method for accessing a modular enclosure.

FIG. 17 illustrates embodiments of methods for use of a modular enclosure 200. The method shown in FIG. 17 may be used in conjunction with any of the systems or devices shown in the above Figures, among others. In various embodiments, some of the method elements shown may be performed concurrently, in a different order than shown, or may be omitted. Additional method elements may also be performed as desired.

Referring to FIG. 17, a method 250 for disengaging the first door bracket 49 on the first door 48 of an enclosure 200 (see FIGS. 1 and 2) is shown. The method 250 can include the step of moving a power handle 260. Moving the power handle 260 can actuate the interlock rod 152 (see FIGS. 11-14). After the step of moving a power handle 260 is performed, the interlock rod 152 can disengage a second door bracket 77 on a second door 76 (see FIGS. 11-14) in the step of disengaging 270. Following the step of disengaging 270, a slam catch mechanism 150 can disengage a first door bracket 49 on a first door 48 (see FIGS. 9 and 10) in the step of moving a slam catch mechanism 280. In some embodiments, the method 250 can include the step of moving a second door lockout mechanism 290. Moving a second door lockout mechanism 290 can be performed so that a blocking portion 150 is moved to block the movement of the interlock rod 152 (see FIGS. 15 and 16). The step of moving a second door lockout mechanism 290 can be performed after moving a slam catch mechanism 280. Moving a second door lockout mechanism can further include a spring biasing the second door lockout mechanism into an "OPENED" position.

In another embodiment of the method 250, moving the slam catch mechanism 280 can further include a second portion 121 of the slam catch mechanism 119 actuating a first portion 120 of the slam catch mechanism 119 so that the first portion 120 disengages the first door bracket 49. Moving the slam catch mechanism can also include a spring 113 biasing the slam catch mechanism 119 into an "LOCKED" position.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A modular enclosure comprising:
   a first enclosure having a first enclosure cavity and including a first door;
   a second enclosure having a second enclosure cavity and including a second door;
   a coupling section having a coupling section cavity, the coupling section being connected to the first enclosure to the second enclosure, and the coupling section cavity provides a passageway from the first enclosure cavity to the second enclosure cavity;
   a power handle connected to the first enclosure, the power handle operable to turn on power to the second enclosure when in an "ON" position or turn off power to the second enclosure when in an "OFF" position; and
   a lockout assembly connected to the coupling section, the lockout assembly configured to prevent the second door from being opened while the power handle is in the "ON" position and to prevent the first door from being opened until the second door has been opened.

2. The modular enclosure of claim 1, wherein the lockout assembly comprises:
   a lockout base; and
   a slam catch mechanism movably mounted on the lockout base, the slam catch mechanism having a slam catch first portion protruding into the first enclosure cavity, and a slam catch second portion protruding into the second enclosure cavity,
   wherein the slam catch first portion is configured to engage a first door bracket when in a "LOCKED" position, and the slam catch second portion is operable to move the slam catch first portion into an "UNLOCKED" position so that the first door bracket is disengaged by the slam catch first portion, and
   wherein the first door is held closed when the slam catch first portion is engaged with the first door bracket.

3. The modular enclosure of claim 2, wherein the slam catch mechanism is a slam catch bar rotatably mounted to the lockout base, the slam catch first portion comprises a latch configured to engage an opening of the first door bracket, and the slam catch second portion comprises a release handle configured to rotate the slam catch bar when pulled.

4. The modular enclosure of claim 2, wherein the lockout assembly further comprises a spring configured to bias the slam catch first portion into the "LOCKED" position.

5. The modular enclosure of claim 2, wherein the first door bracket is configured to move the slam catch mechanism first portion from the "LOCKED" position to the "UNLOCKED" position as the first door is closed.

6. The modular enclosure of claim 1, further comprising an interlock rod extending from the first enclosure cavity into the second enclosure cavity, the interlock rod being linked to the power handle so that the interlock rod is movable from a "LOCKED" position when the power handle is in the "ON" position to an "UNLOCKED" position when the power handle is in the "OFF" position; and
   wherein the second door includes a second door bracket, and the second door bracket is configured to be engaged by the interlock rod when the interlock rod is moved into the "LOCKED" position, and disengaged by the interlock rod when the interlock rod is moved into the "UNLOCKED" position.

7. The modular enclosure of claim 6, wherein the lockout assembly comprises:
   a lockout base;
   a second door lockout mechanism movably mounted on the lockout base and having a blocking portion, the second door lockout mechanism being movable between an "OPENED" position and a "CLOSED" position; and
   wherein the blocking portion is configured to block the interlock rod from moving from the "UNLOCKED" position to the "LOCKED" position when the second door lockout mechanism is in the "OPENED" position.

8. The modular enclosure of claim 7, wherein the second door lockout mechanism is a second door lockout bar rotatably attached to the lockout base, the second door lockout bar being configured so that the second door bracket pushes the second door lockout bar from the "OPENED" position to the "CLOSED" position when the second door is closed.

9. The modular enclosure of claim 8, wherein the lockout assembly further comprises a spring configured to bias the second door lockout mechanism into the "OPENED" position.

10. The modular enclosure of claim 1, further comprising a gland plate coupled to at least one of the first enclosure, the second enclosure, and the coupling section, the gland plate configured to at least partially restrict the passageway from the first enclosure cavity to the second enclosure cavity, and wherein the gland plate provides arc flash protection.

11. The modular enclosure of claim 1, wherein the first enclosure is oriented above the coupling section and the second enclosure.

12. A modular enclosure comprising:
    a first enclosure having a first enclosure cavity and including a first door;
    a second enclosure coupled to the first enclosure, the second enclosure having a second enclosure cavity and including a second door;
    a power handle connected to the first enclosure, the power handle operable to turn on power to the second enclosure in an "ON" position or turn off power to the second enclosure in an "OFF" position; and
    a lockout assembly configured to prevent the second door from being opened while the power handle is in an "ON" position, and including a slam catch mechanism to prevent the first door from being opened until the second door has been opened.

13. The modular enclosure of claim 12, wherein the first door includes a first door bracket having a first door bracket opening; and
    the slam catch mechanism is a slam catch bar including a latch configured to engage the first door bracket opening when the slam catch bar is in a "LOCKED" position, and a release handle configured to rotate the slam catch bar into an "UNLOCKED" position when pulled, wherein the latch is configured to disengage the first door bracket when in the "UNLOCKED" position, and the first door is held closed when the first door bracket is engaged by the latch.

14. The modular enclosure of claim 12, further comprising an interlock rod extending from the first enclosure cavity into the second enclosure cavity, the interlock rod being linked to the power handle so that the interlock rod is movable from a "LOCKED" position when the power handle is in the "ON" position to an "UNLOCKED" position when the power handle is in the "OFF" position;

wherein the second door includes a second door bracket, and the second door bracket is configured to be engaged by the interlock rod when the interlock rod is in the "LOCKED" position, and disengaged by the interlock rod when the interlock rod is in the "UNLOCKED" position, the second door bracket further configured to hold the second door closed when engaged by the interlock rod; and the lockout assembly further comprises a second door lockout mechanism having a blocking portion, the second door lockout mechanism being movable between an "OPENED" position and a "CLOSED" position, wherein the blocking portion is configured to block the interlock rod from moving from the "UNLOCKED" position to the "LOCKED" position when the second door lockout mechanism is in the "OPENED" position.

15. The modular enclosure of claim 12, further comprising a gland plate coupled to at least one of the first enclosure and the second enclosure, the gland plate configured to at least partially restrict a passageway from the first enclosure cavity to the second enclosure cavity, and wherein the gland plate provides arc flash protection.

16. A method of disengaging a first door bracket on a first door of an enclosure, the enclosure having the first door and a second door, the method comprising:

moving a power handle on the enclosure to actuate an interlock rod;

the interlock rod disengaging a second door bracket on the second door; and subsequent to the second door opening, moving a slam catch mechanism to disengage the first door bracket on the first door.

17. The method of claim 16, wherein moving the slam catch mechanism further comprises a second portion of the slam catch mechanism actuating a first portion of the slam catch mechanism so that the first portion disengages the first door bracket.

18. The method of claim 16, further comprising the step of moving a second door lockout mechanism so that a blocking portion of the second door lockout mechanism is blocking movement of the interlock rod, wherein moving the second door is performed after moving the slam catch mechanism.

19. The method of claim 18, wherein moving the second door lockout mechanism further comprising a spring biasing the second door lockout mechanism into an "OPENED" position to block the movement of the interlock rod.

20. The method of claim 16, wherein moving a slam catch mechanism further comprises a spring biasing the slam catch mechanism into a "LOCKED" position.

* * * * *